United States Patent
Sato

(10) Patent No.: US 7,983,859 B2
(45) Date of Patent: Jul. 19, 2011

(54) SYSTEM AND METHOD FOR ANALYZING DEFECTS ON A WAFER

(75) Inventor: Yoshiyuki Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 366 days.

(21) Appl. No.: 12/236,309

(22) Filed: Sep. 23, 2008

(65) Prior Publication Data

US 2009/0082979 A1  Mar. 26, 2009

(30) Foreign Application Priority Data

Sep. 26, 2007 (JP) ................. 2007-248955
Jun. 6, 2008 (JP) ................. 2008-149303

(51) Int. Cl.
*G01R 31/00* (2006.01)
*G06F 17/40* (2006.01)

(52) U.S. Cl. ............. 702/59; 702/35; 702/58; 324/537; 700/110

(58) Field of Classification Search ............ 702/59, 702/58, 35, 81, 83, 118
See application file for complete search history.

(56) References Cited

U.S. PATENT DOCUMENTS

| | | | | |
|---|---|---|---|---|
| 5,991,699 A | * | 11/1999 | Kulkarni et al. | 702/83 |
| 6,549,863 B1 | * | 4/2003 | Morinaga | 702/81 |
| 7,222,026 B2 | | 5/2007 | Matsushita et al. | |
| 2006/0100730 A1 | * | 5/2006 | Parkes et al. | 700/108 |
| 2008/0058977 A1 | * | 3/2008 | Honda | 700/110 |

* cited by examiner

*Primary Examiner* — Hal D Wachsman
(74) *Attorney, Agent, or Firm* — Finnegan, Henderson, Farabow, Garrett & Dunner, L.L.P.

(57) ABSTRACT

A defect analyzer system having a program storage device storing instructions and an arithmetic unit executing the instructions. The system divides a defect analyzing region of a wafer into a plurality of grid squares and classifies the grid squares into a plurality of groups. The system then matches the defect information with the defect analyzing region. The defect information includes defect positions and sizes detected in the defect analyzing region. The system calculates a defect size distribution for each defect size in each of the groups, compares the defect size distribution and a predetermined estimation distribution for each of the groups, and calculates a difference. The system then compares the difference of each of the groups and a predetermined threshold value, extracts the group having the difference equal to or smaller than the predetermined threshold value, and outputs the defect information corresponding to the extracted group.

15 Claims, 16 Drawing Sheets

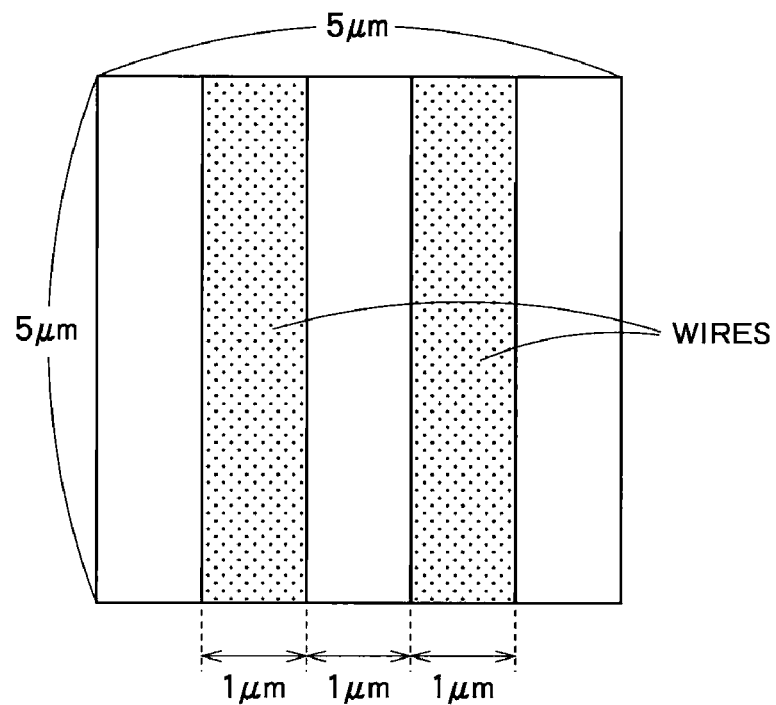
F I G. 2
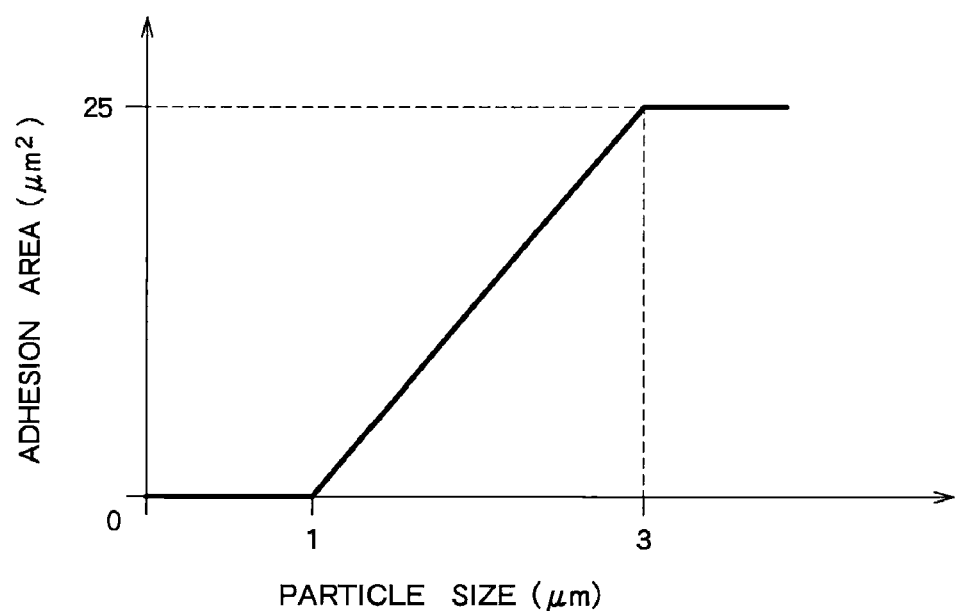
F I G. 3

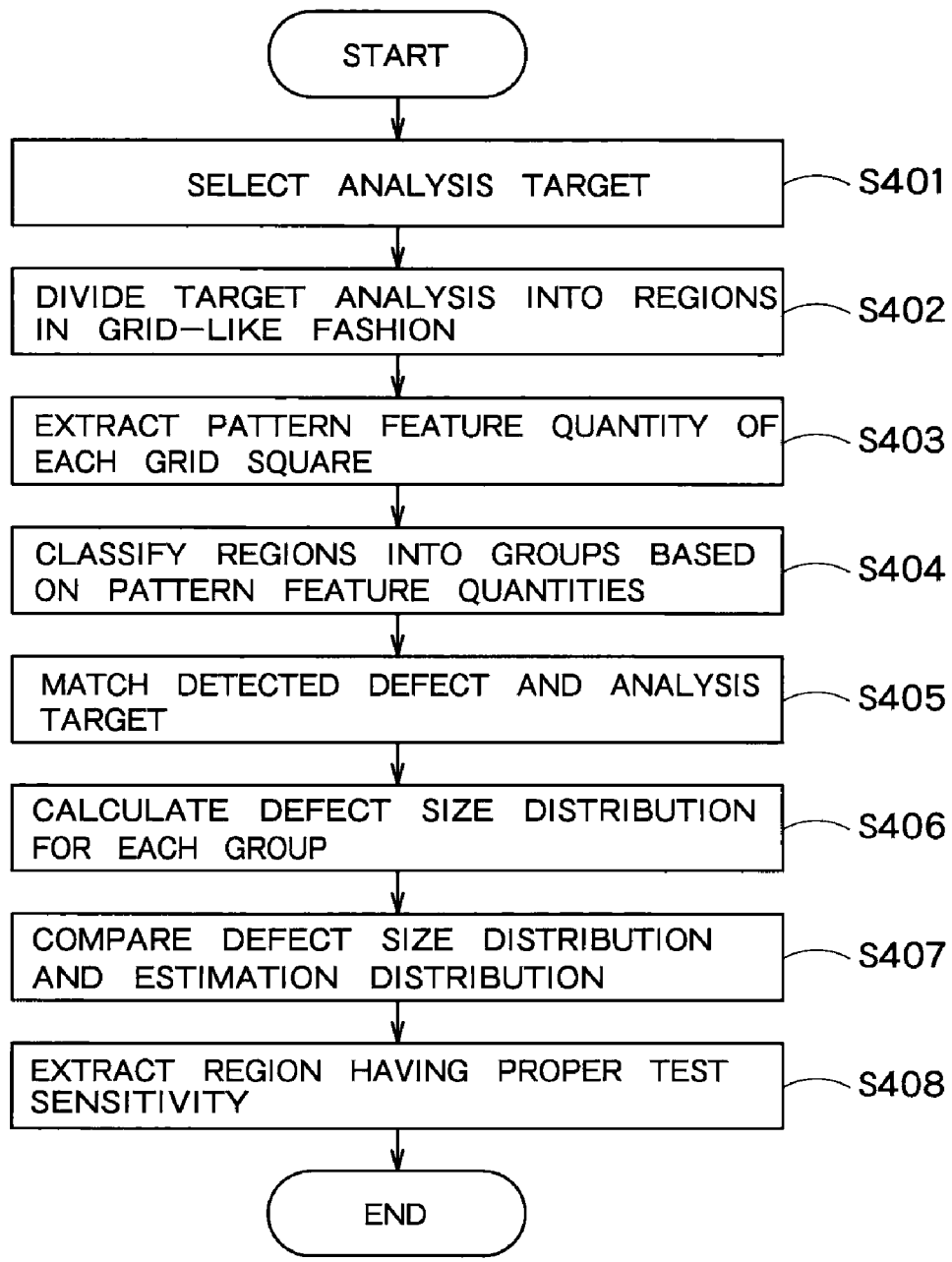
F I G. 4

| 1 | 1 | 1 | 1 | 1 | 1 | 1 | 1 |
|---|---|---|---|---|---|---|---|
| 1 | 5 | 7 | 6 | 4 | 7 | 1 | 1 |
| 1 | 1 | 2 | 3 | 7 | 1 | 2 | 1 |
| 2 | 4 | 3 | 4 | 9 | 6 | 1 | 1 |
| 3 | 5 | 4 | 5 | 8 | 4 | 3 | 1 |
| 2 | 4 | 2 | 1 | 4 | 2 | 5 | 1 |
| 2 | 4 | 3 | 7 | 9 | 7 | 4 | 1 |
| 1 | 1 | 1 | 2 | 2 | 1 | 1 | 1 |

FIG. 7

| A | A | A | A | A | A | A | A |
|---|---|---|---|---|---|---|---|
| A | B | C | B | B | C | A | A |
| A | A | A | A | C | A | A | A |
| A | B | A | B | C | B | A | A |
| A | B | B | B | C | B | A | A |
| A | B | A | A | B | A | B | A |
| A | B | A | C | C | C | B | A |
| A | A | A | A | A | A | A | A |

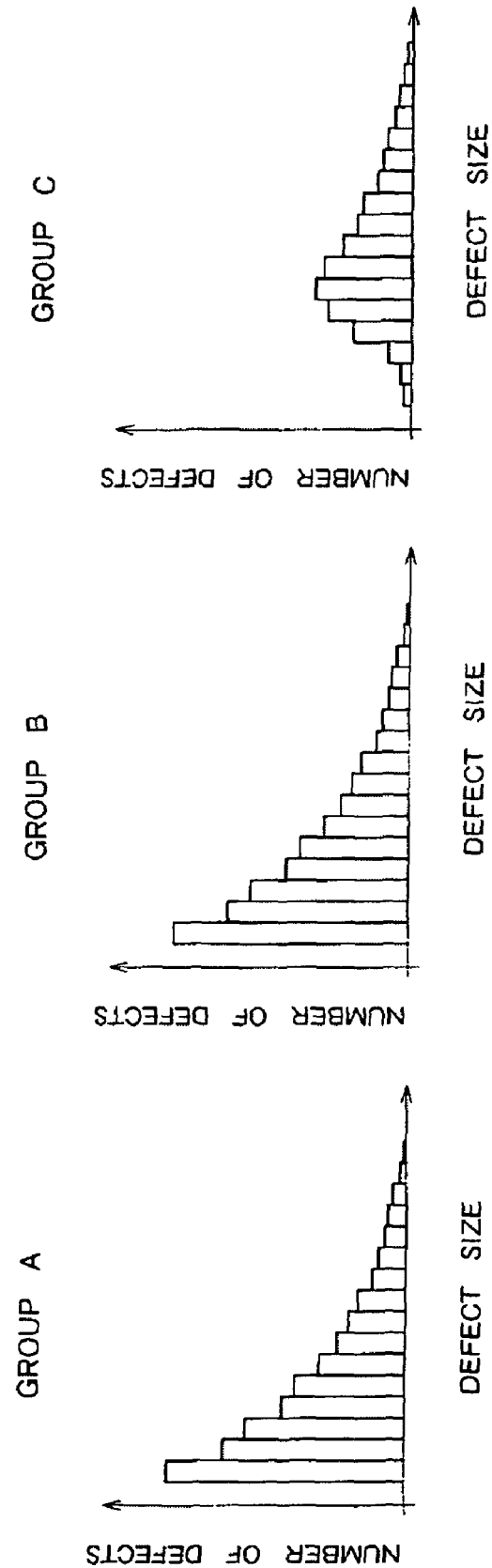

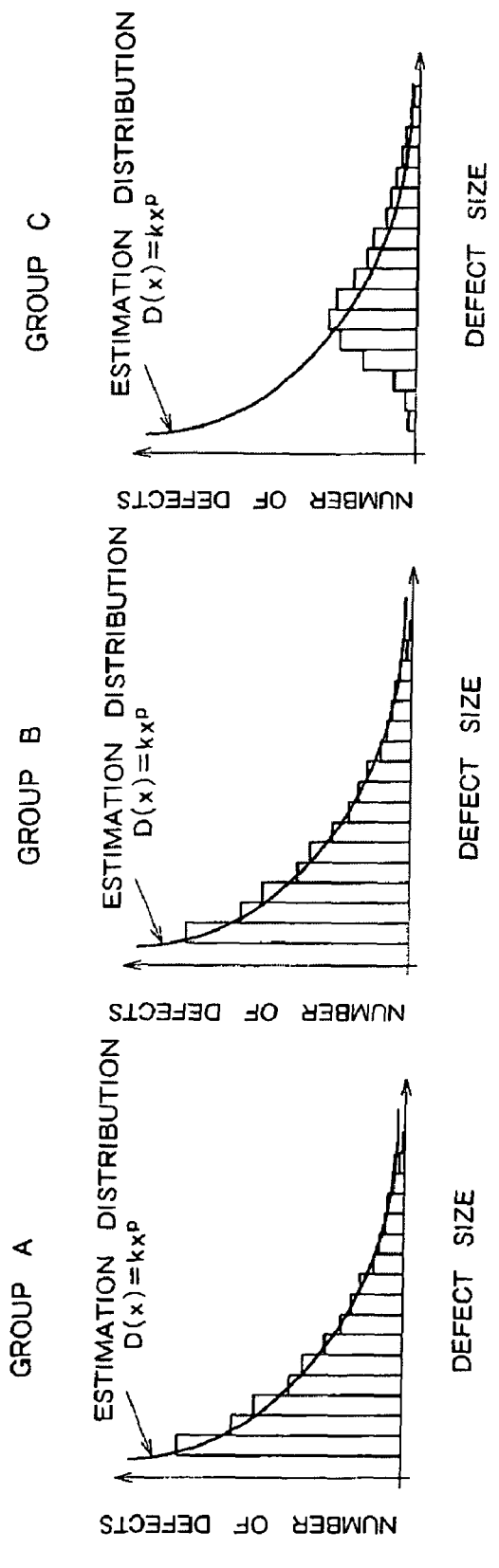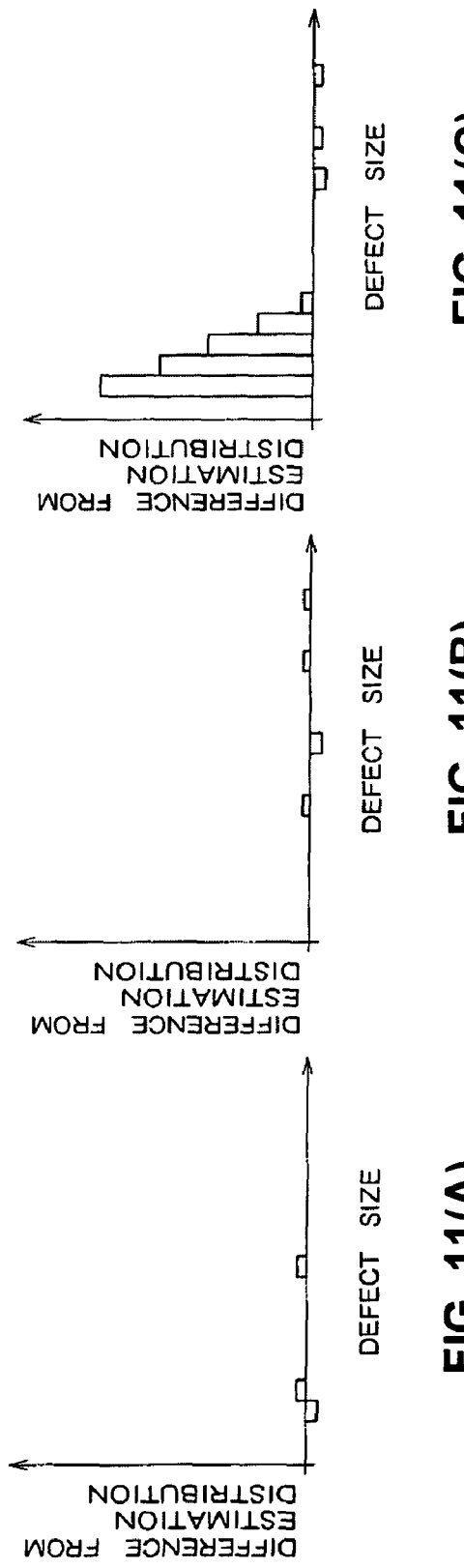
FIG. 11(A)  FIG. 11(B)  FIG. 11(C)

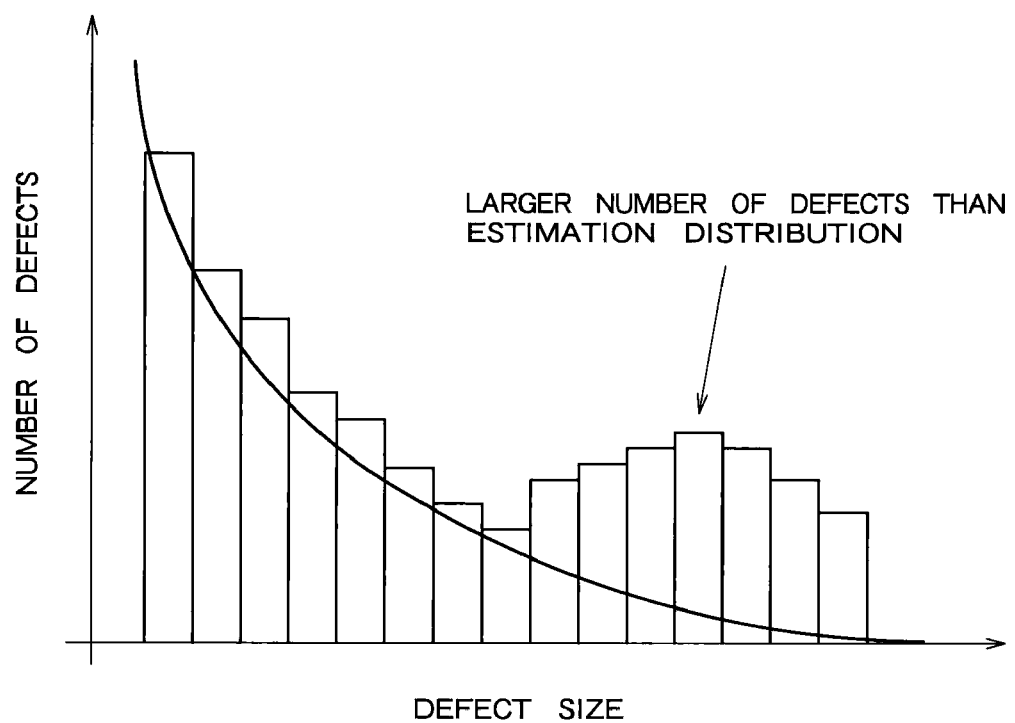
F I G. 13

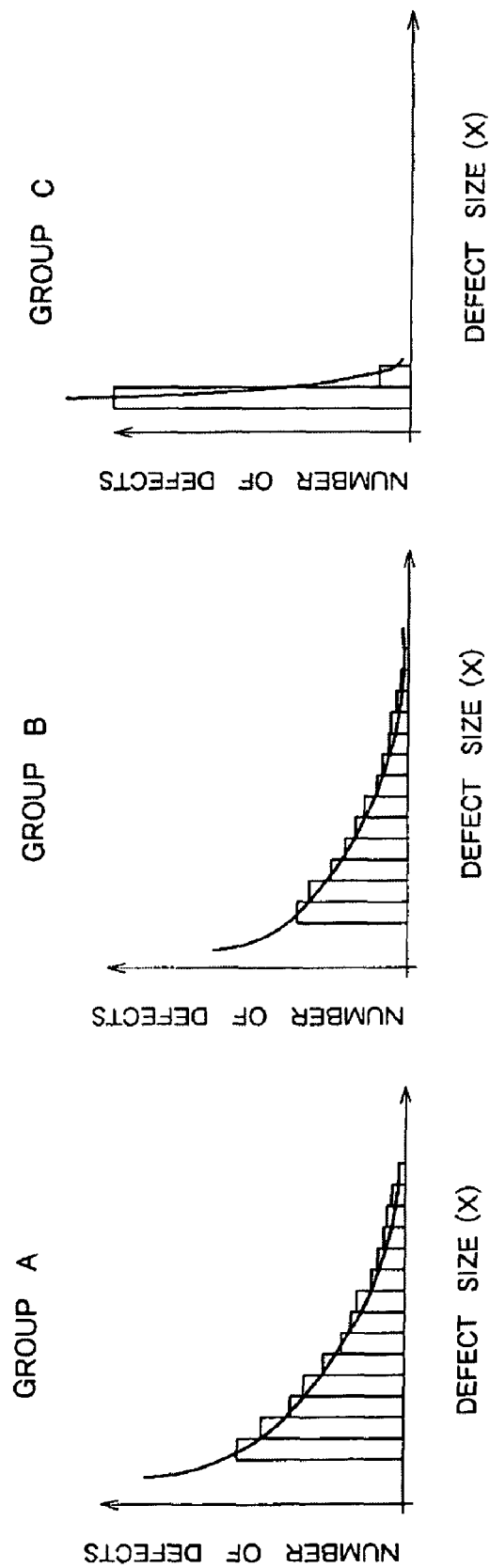

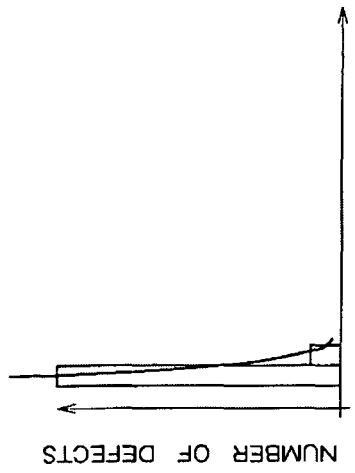
FIG. 18(A) GROUP A
SIZE DISTRIBUTION A
D(X) = kX^(-p)
p=2.5
⇒ RANDOM DEFECT
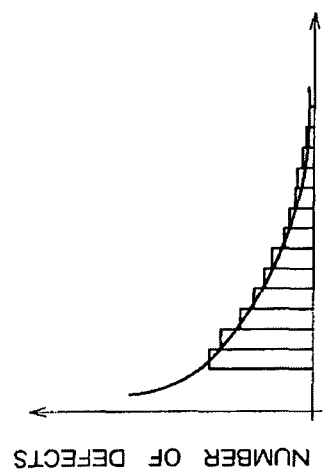
FIG. 18(B) GROUP B
SIZE DISTRIBUTION B
D(X) = kX^(-p)
p=2.2
⇒ RANDOM DEFECT
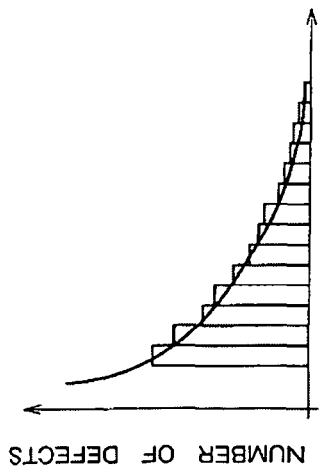
FIG. 18(C) GROUP C
SIZE DISTRIBUTION C
D(X) = kX^(-p)
p=8
⇒ SYSTEMATIC DEFECT
EXAMPLE OF DETERMINATION WHEN RANDOM DISTRIBUTION IS 2<p<3

FIG. 19(A)

| A | A | A | A | A | A | A | A |
|---|---|---|---|---|---|---|---|
| A | B | C | B | B | C | A | A |
| A | A | A | A | C | B | A | A |
| A | B | A | B | C | B | A | A |
| A | B | B | B | C | A | A | A |
| A | B | A | A | B | A | B | A |
| A | B | A | C | C | C | B | A |
| A | A | A | A | A | A | A | A |

FIG. 19(B)

GROUP A : 14
GROUP B : 2
GROUP C : 4
    TOTAL : 20

SYSTEM AND METHOD FOR ANALYZING DEFECTS ON A WAFER

CROSS REFERENCE TO RELATED APPLICATION

This application is based upon and claims the benefit of priority from the prior Japanese Patent Application No. 2007-248955, filed on Sep. 26, 2007, and the Japanese Patent Application No. 2008-149303, filed on Jun. 6, 2008, the entire contents of which are incorporated herein by reference.

BACKGROUND OF THE INVENTION

The present invention relates to a defect analyzer and a defect analyzing method.

In the manufacturing process of a semiconductor device, a number of elements having patterns formed in multiple layers are fabricated on a semiconductor wafer. The completed elements undergo tests on electrical characteristics and defective items are removed from an assembling process. In the manufacturing process of a semiconductor device, yields are quite important and test results on the electrical characteristics are fed back to the manufacturing process and are used for the management of each process.

However, the manufacturing process of a semiconductor device is made up of a number of steps and it takes quite a long time from the start of manufacturing to tests on electrical characteristics. Thus even when defects are found in the manufacturing process through the tests on electrical characteristics, a number of wafers are being processed at that time, so that the tests results cannot be sufficiently used for improving yields.

Thus defect tests for testing formed patterns in the steps of a process (for example, for each layer) and detecting defects (including a foreign matter and a faulty pattern) have been conducted. The defect tests in the multiple steps of the overall process make it possible to quickly detect the occurrence of a defect, so that test results can be immediately reflected in process management.

The defect tests are conducted by emitting test light to a wafer, condensing reflected light through a lens, forming an image with an image sensor, and comparing the image with a reference image. The intensity of reflection of test light varies among patterns on the wafer. When the tests are conducted at the same light level while the intensity of received light has a constant threshold value for identifying defects, a region where a defect is likely to be detected (high sensitivity region) and a region where a defect is unlikely to be detected (low sensitivity region) appear. Thus for example, in memory products including a small number of cells with simple shapes, the defect tests are conducted while different sensitivities are manually set for cell portions and surrounding circuit portions through visual observations of wafers.

However, in the case of logic products having random patterns, a number of high sensitivity regions and low sensitivity regions are scattered and thus sensitivity setting has been quite difficult. For this reason, in logic products, wafers are entirely tested at the same sensitivity and defect data outputted as test results varies in information quality (accuracy) among regions.

When data with information quality varying among test regions is simultaneously handled as it is, the accuracy of the subsequent defect analysis including the prediction of yields may decrease.

Defects are broadly divided into random defects caused by dust generated from manufacturing equipment and systematic defects caused by a mismatch in a manufacturing process and a pattern design. These defects are desirably handled in a classified manner because of completely different occurrence mechanisms and solutions.

As a technique for classifying these defects, a method is known in which the clustering degree of a defect detected in a defect test is determined using a distance from an adjacent defect and a random component and a clustering component are separated from each other.

In this conventional technique, however, when defects are caused by multiple factors on a wafer and when systematic defects (defects which look like a random distribution and are caused by a process margin) not having regionality are present, the defects cannot be classified with high accuracy, thereby reducing the accuracy of defect analysis.

SUMMARY OF THE INVENTION

According to one aspect of the present invention, there is provided a defect analyzer comprising:

a region dividing section configured to divide a defect analyzing region of a wafer into a plurality of grid squares, the wafer having a circuit pattern formed thereon;

a pattern feature quantity storing unit configured to store a pattern feature quantity based on design data of the circuit pattern;

a pattern feature quantity extracting section configured to extract a pattern feature quantity for each of the grid squares from the pattern feature quantity storing unit;

a region classifying section configured to classify the plurality of grid squares into a plurality of groups based on the pattern feature quantities;

a defect information storing unit configured to store defect information including a defect position and size having been detected in the defect analyzing region;

a defect coordinate matching section configured to extract the defect information from the defect information storing unit and match the defect information with the defect analyzing region;

a defect size distribution calculating section configured to determine the number of defects for each defect size in each of the plurality of groups and calculate a defect size distribution;

a distribution comparing section configured to compare the defect size distribution and a predetermined estimation distribution in each of the plurality of groups and calculate a difference; and a region extracting section configured to compare the difference of each of the plurality of groups and a predetermined threshold value, extract the group having the difference equal to or smaller than the threshold value, and output the defect information corresponding to the extracted group.

According to one aspect of the present invention, there is provided a defect analyzing method comprising:

dividing a defect analyzing region of a wafer into a plurality of grid squares, the wafer having a circuit pattern formed thereon;

extracting a pattern feature quantity for each of the grid squares based on design data of the circuit pattern;

classifying the plurality of grid squares into a plurality of groups based on the pattern feature quantities;

matching the defect analyzing region with defect information including a defect position and size having been detected in the defect analyzing region;

determining the number of defects for each defect size in each of the plurality of groups and calculating a defect size distribution;

comparing the defect size distribution of each of the plurality of groups and a predetermined estimation distribution and calculating a difference;

comparing the difference of each of the plurality of groups and a predetermined threshold value and extracting the defect information corresponding to the group having the difference equal to or smaller than the threshold value; and performing defect analysis using the extracted defect information.

According to one aspect of the present invention, there is provided a defect analyzer comprising:

a region dividing section configured to divide a defect analyzing region of a wafer into a plurality of grid squares, the wafer having a circuit pattern formed thereon;

a pattern feature quantity storing unit configured to store a pattern feature quantity based on design data of the circuit pattern;

a pattern feature quantity extracting section configured to extract a pattern feature quantity for each of the grid squares from the pattern feature quantity storing unit;

a region classifying section configured to classify the plurality of grid squares into a plurality of groups based on the pattern feature quantities;

a defect information storing unit configured to store defect information including a defect position and size having been detected in the defect analyzing region;

a defect coordinate matching section configured to extract the defect information from the defect information storing unit and match the defect information with the defect analyzing region;

a defect size distribution calculating section configured to determine the number of defects for each defect size in each of the plurality of groups and calculate a defect size distribution; and a defect type identifying section configured to identify whether the defects in each of the plurality of groups are random defects or systematic defects, based on the defect size distribution.

According to one aspect of the present invention, there is provided a defect analyzing method comprising:

dividing a defect analyzing region of a wafer into a plurality of grid squares, the wafer having a circuit pattern formed thereon;

extracting a pattern feature quantity for each of the grid squares based on design data of the circuit pattern;

classifying the plurality of grid squares into a plurality of groups based on the pattern feature quantities;

matching the defect analyzing region with defect information including a defect position and size having been detected in the defect analyzing region;

determining the number of defects for each defect size in each of the plurality of groups and calculating a defect size distribution;

identifying whether the defects in each of the plurality of groups are random defects or systematic defects, based on the defect size distribution;

determining a priority order of defect analysis on the plurality of groups based on an identification result and extracting the defect information corresponding to each of the groups according to the priority order; and performing defect analysis using the extracted defect information.

BRIEF DESCRIPTION OF THE DRAWINGS

FIG. 2 illustrates an example of a wiring pattern;

FIG. 3 is a graph showing the relationship between a particle size and an adhesion area where a chip failure occurs;

FIG. 4 is a flowchart showing a defect analyzing method of the first embodiment;

FIG. 7 illustrates an example of pattern feature quantities corresponding to the squares of a grid;

FIG. 8 illustrates an example of groups corresponding to the pattern feature quantities;

FIG. 9 illustrates an example of matching of defect positions and the analysis target;

FIGS. 10(A)-(C) illustrate graphs each of which shows an example of a defect size distribution;

FIGS. 11(A)-(C) illustrate graphs each of which shows a comparison and a difference between a defect size distribution and an estimation distribution;

FIG. 13 is a graph showing an example of a defect size distribution;

FIGS. 16(A)-(C) illustrate graphs each of which shows an example of a defect size distribution;

FIGS. 18(A)-(C) illustrate an example of the determination of random defects and systematic defects; and FIGS. 19(A) and 19(B) illustrate an example of a grid where defects have been detected.

DESCRIPTION OF THE EMBODIMENTS

Embodiments of the present invention will be described below in accordance with the accompanying drawings.

First Embodiment

Figure 1:
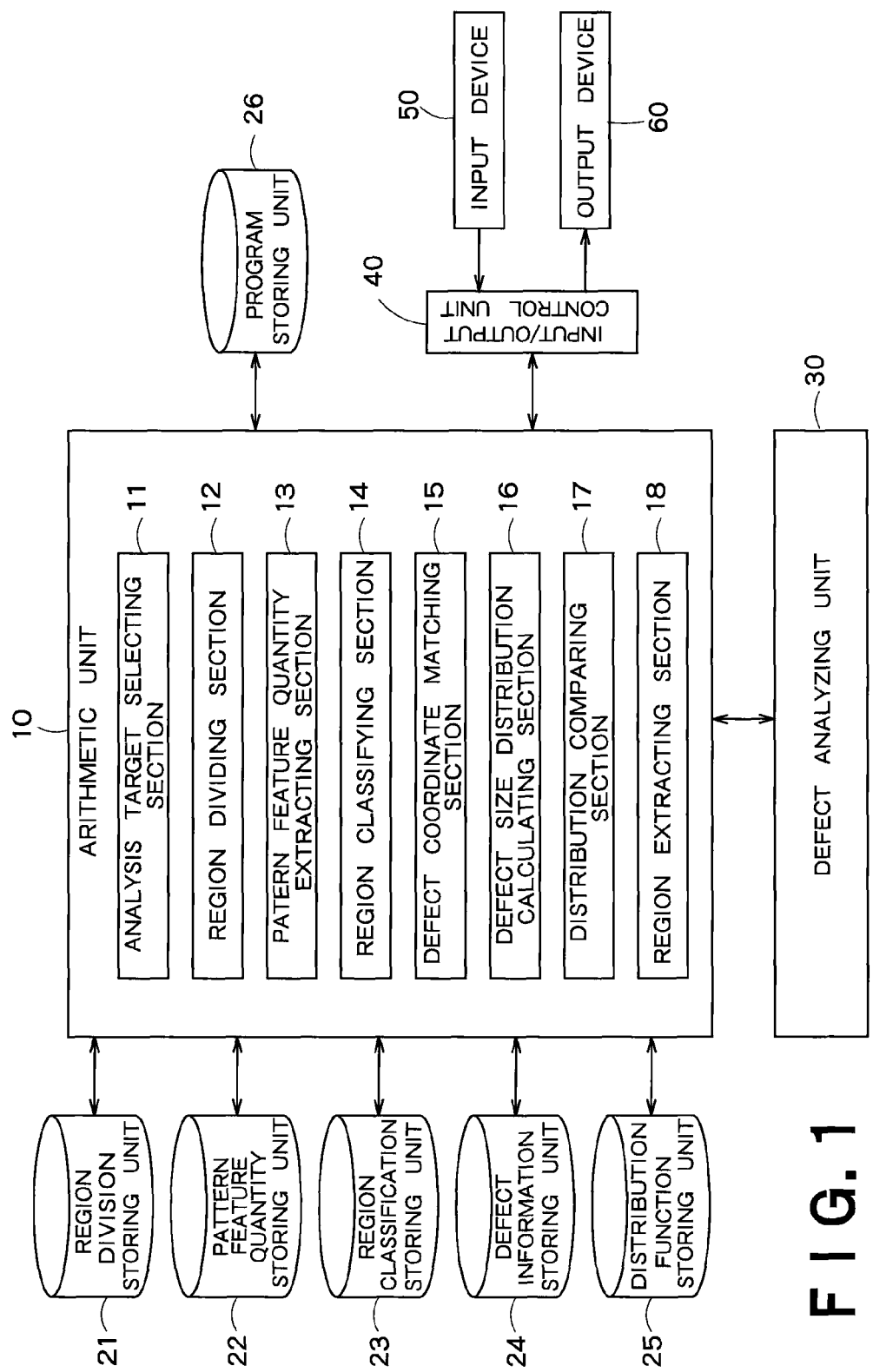
FIG. 1 is a schematic structural diagram of a defect analyzer according to a first embodiment of the present invention.

FIG. 1 shows a schematic configuration of a defect analyzer according to a first embodiment of the present invention. The defect analyzer includes an arithmetic unit 10, a region division storing unit 21, a pattern feature quantity storing unit 22, a region classification storing unit 23, a defect information storing unit 24, a distribution function storing unit 25, a program storing unit 26, and a defect analyzing unit 30. The storing units and the defect analyzing unit 30 are connected to the arithmetic unit 10.

To the arithmetic unit 10, an input device 50 and an output device 60 are connected via an input/output control unit 40. The input device 50 receives an input such as data and a command from an operator and the output device 60 outputs a region where a defect analysis is performed.

The arithmetic unit 10 has an analysis target selecting section 11, a region dividing section 12, a pattern feature quantity extracting section 13, a region classifying section 14, a defect coordinate matching section 15, a defect size distribution calculating section 16, a distribution comparing section 17, and a region extracting section 18.

The arithmetic unit 10 operates in response to a program command stored in the program storing unit 26.

The analysis target selecting section 11 selects a defect analysis target. To be specific, the analysis target selecting section 11 designates a kind of product, a manufacturing process of the product, and a region in the product.

The region dividing section 12 reads, from the region division storing unit 21, a region dividing definition corresponding to the analysis target and divides the selected analysis target into regions with a given size in a grid-like fashion.

The pattern feature quantity extracting section 13 extracts, from the pattern feature quantity storing unit 22, a pattern feature quantity having been converted to a number for each divided region (grid square). The pattern feature quantity is, for example, at least one selected from the coverage factor (=wiring area/grid square area) of a pattern, the perimeter of the pattern, a defect size based on a critical area analysis, and so on. The pattern feature quantity can be determined from design data (mask data).

For example, as shown in FIG. 2, wires having a width of 1 μm are formed like belts at intervals of 1 μm in a 5 μm grid square. When the size of a particle (particulate foreign matter) adhering to the grid square is less than 1 μm, a chip failure does not occur wherever the particle adheres in the grid square. The larger the particle size is, the larger an adhesion area where a chip failure occurs. A particle having a size of 3 μm or larger causes a chip failure wherever the particle adheres in the grid square.

FIG. 3 shows the relationship between a particle size and an adhesion area where a chip failure occurs. When the particle size is smaller than 1 μm, the adhesion area is 0 μm². When the particle size is 3 μm or larger, the adhesion area is 25 μm².

A defect size based on the critical area analysis includes, for example, a particle (defect) size having an adhesion area other than 0 and a particle size having an adhesion area equal to the grid square area.

The region classifying section 14 reads, from the region classification storing unit 23, a classification definition based on a feature quantity and classifies grid squares into a plurality of groups according to the definition.

The defect coordinate matching section 15 reads position information about defects from the defect information storing unit 24 and superimposes the defects on the analysis target.

The defect size distribution calculating section 16 determines the number of defects for each size in each group and calculates a defect size distribution.

The distribution comparing section 17 reads, from the distribution function storing unit 25, an estimation distribution premised on random defects, and determines, for each group, a difference between the estimation distribution and the defect size distribution having been calculated by the defect size distribution calculating section 16.

The region extracting section 18 compares the difference having been determined by the distribution comparing section 17 and a predetermined threshold value, and determines whether the detection sensitivity of a defect test is proper or not. In the case of a small difference, that is, when the defect size distribution is close to the estimation distribution premised on random defects, the region extracting section 18 determines that the detection sensitivity is proper.

On the contrary, in the case of a large difference, that is, when the defect size distribution is deviated from the estimation distribution premised on random defects, it can be considered that expected detection is not performed. Thus the region extracting section 18 determines that the detection sensitivity is not proper.

A group having a proper detection sensitivity is extracted, that is, a group having a difference equal to or smaller than the predetermined threshold value is extracted, and the defect data of the group is transmitted to the defect analyzing unit 30.

The defect analyzing unit 30 analyzes defects by using the received defect data. The defect analysis includes, for example, data processing such as yield prediction and the acquisition of an image through a defect observing device.

The defect analyzing unit 30 uses only the defect data of the group whose detection sensitivity have been judged as being proper, thereby achieving defect analysis with high accuracy. It is thus possible to accurately identify the occurrence level of random defects in a manufacturing line and predict the manufacturing yields of a product.

Such a defect analyzing method will now be described in accordance with the flowchart of FIG. 4 and an example shown in FIGS. 5 to 11.

Figure 5:
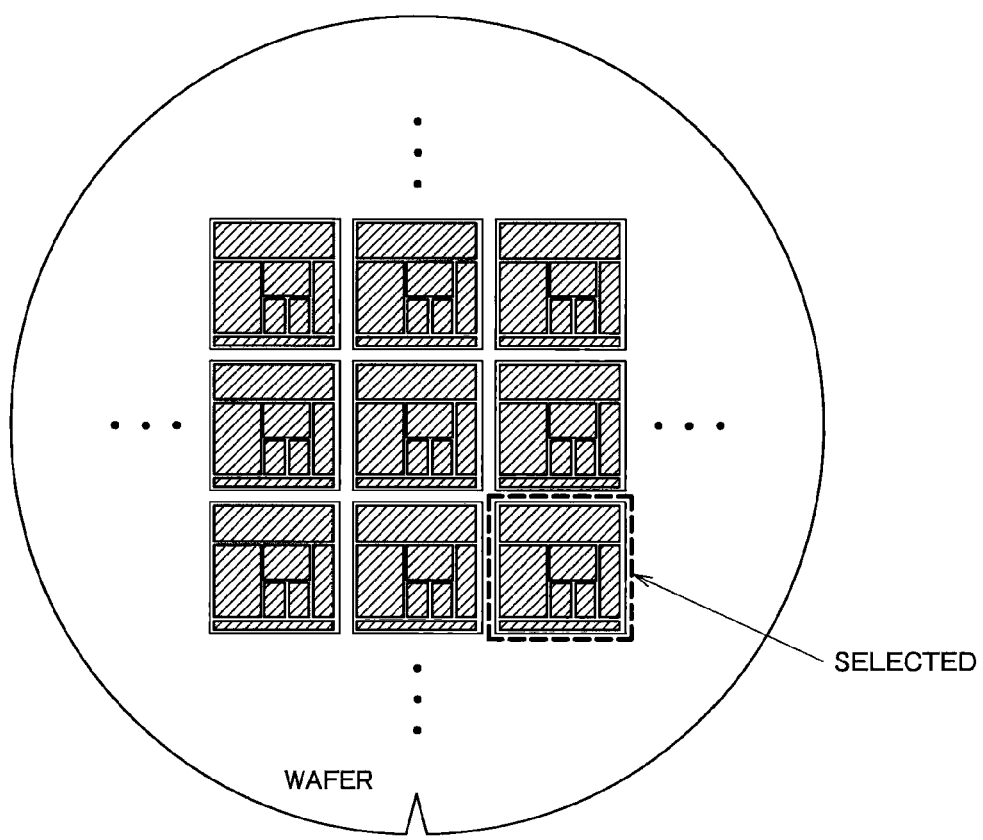
FIG. 5 illustrates an example of the selection of an analysis target.

(Step S401) The analysis target selecting section 11 selects an analysis target. For example, as shown in FIG. 5, a region of a wafer is selected.

Figure 6:
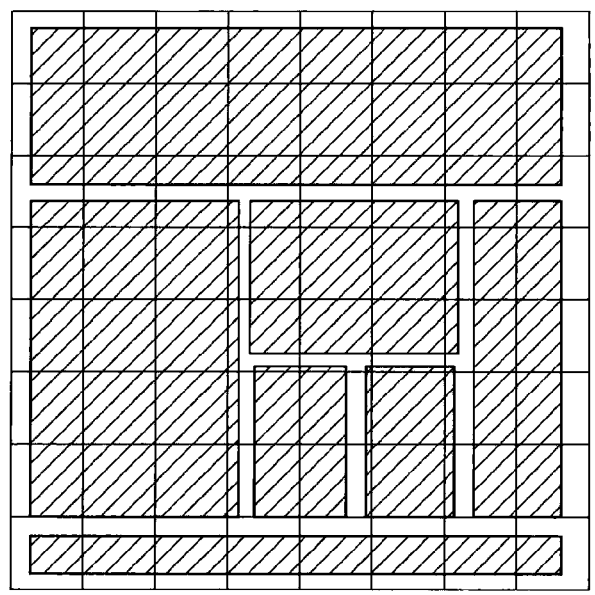
FIG. 6 illustrates an example of the division of the analysis target.

(Step S402) The region dividing section 12 divides the analysis target into regions in a grid-like fashion. For example, as shown in FIG. 6, the analysis target is divided into regions of a certain size in a grid-like fashion.

(Step S403) The pattern feature quantity extracting section 13 converts a pattern feature quantity into a number for each grid square and extracts the number. For example, as shown in FIG. 7, the pattern feature quantity extracting section 13 extracts feature quantities having been converted into numbers of 1 to 9 for the grid squares.

(Step S404) The region classifying section 14 classifies the grid squares into groups based on the feature quantities. For example, as shown in FIG. 8, the grid squares having feature quantities of 1 to 3 are designated as group A, the grid squares having feature quantities of 4 to 6 are designated as group B, and the grid squares having feature quantities of 7 to 9 are designated as group C.

Figure 9:
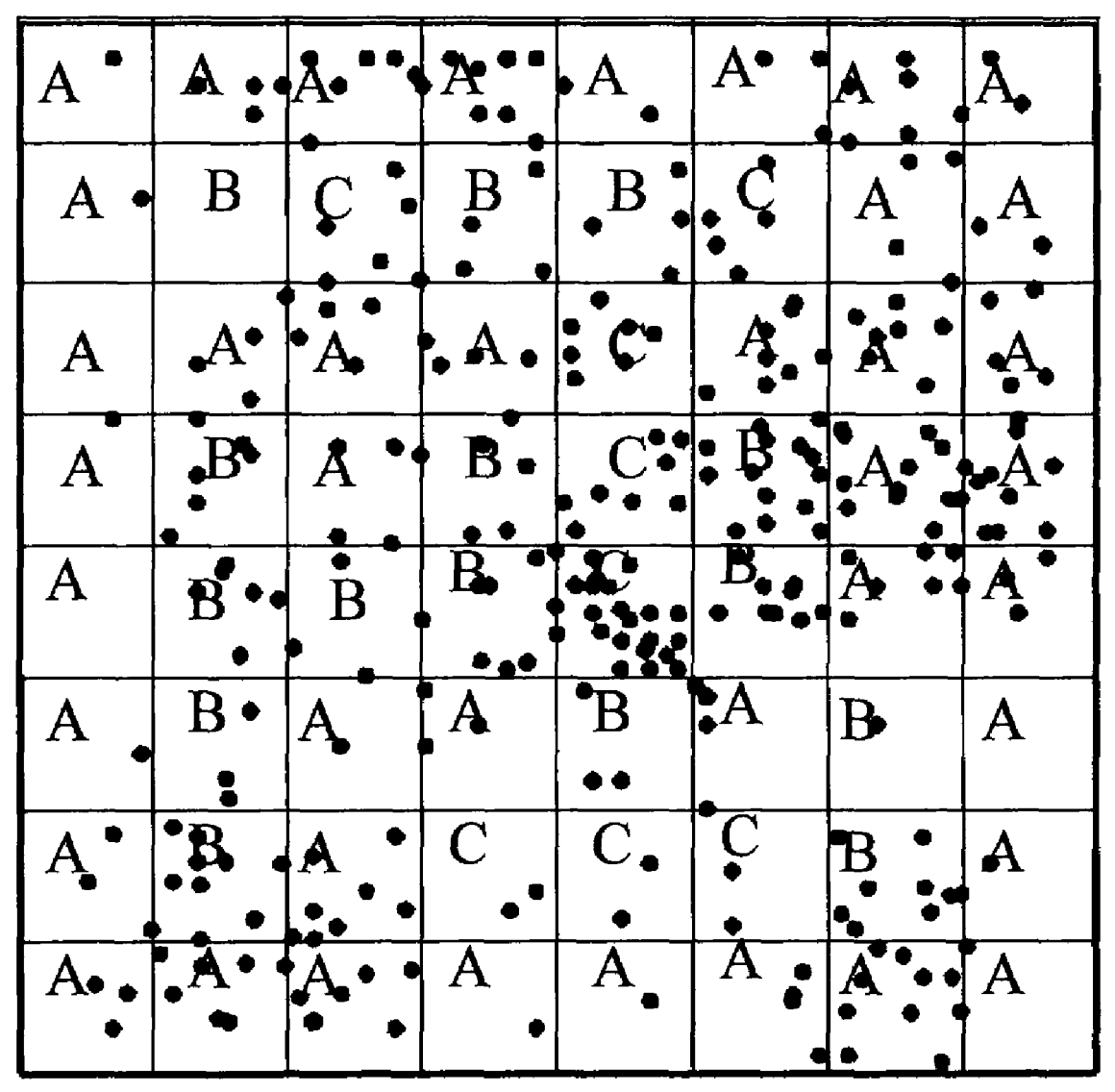

(Step S405) The defect coordinate matching section 15 matches defect position information with the analysis target. For example, as shown in FIG. 9, detected defects are superimposed on the analysis target.

(Step S406) The defect size distribution calculating section 16 calculates a defect size distribution for each group. For example, as shown in FIG. 10, the number of defects of each size is determined for group A, group B, and group C.

(Step S407) The distribution comparing section 17 compares the defect size distribution having been determined in step S406 and the estimation distribution premised on random defects, and calculates a difference for each group.

For example, as shown in FIG. 11, a difference from the estimation distribution is determined for each of groups A to C. It is considered that as the defect size increases, the number of defects decreases. Thus an estimation distribution "D(x)" can be represented as $D(x)=kx^p$ where "x" is a defect size ("k" and "p" are real numbers specified for the product).

A difference "E" between the defect size distribution and the estimation distribution "D(x)" can be represented as $E=\int |Dr(x)-D(x)|dx$ where "Dr(x)" is a defect size distribution. The difference "E" is determined for each of groups A to C.

(Step S408) The region extracting section 18 extracts the group having a difference equal to or smaller than the threshold value, as regions (group) where a test has been conducted with a proper sensitivity. For example, in FIG. 11, groups A and B have small differences and group C has a large difference. It is thus determined that tests have been conducted with proper sensitivities in groups A and B and group C has an improper sensitivity in tests.

After that, defect analysis is performed using only defect detection data in the regions (grid squares) of groups A and B.

As described above, by using only the defect data of the groups where the detection sensitivities have been judged as being proper, defect analysis can be performed with high accuracy. It is thus possible to accurately identify the occurrence level of random defects in the manufacturing line and predict the manufacturing yields of the product.

Figure 12:
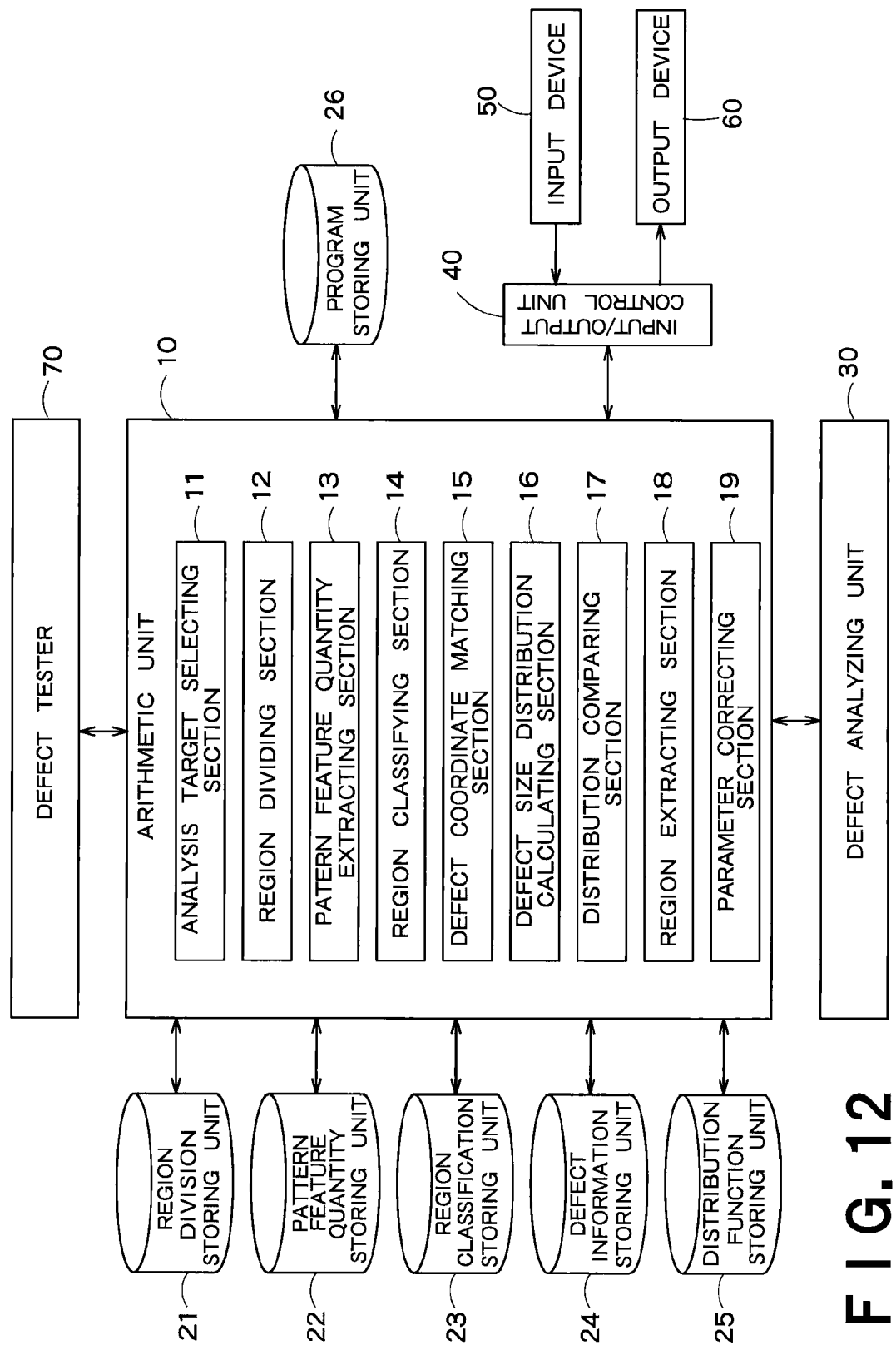
FIG. 12 is a schematic structural diagram showing a defect analyzer of a modification.

As shown in FIG. 12, the arithmetic unit 10 may further include a parameter correcting section 19. The parameter correcting section 19 corrects the test parameter of a defect tester 70 so as to have a proper sensitivity in the group where the region extracting section 18 determines that a difference is large, that is, the group where a defect test sensitivity has been judged as being improper.

For example, in the example of FIG. 11, it is estimated that small defects are not detected in group C. Thus the parameter correcting section 19 adjusts the parameter of the defect tester 70 so as to facilitate the detection of small defects. Further, as shown in FIG. 13, when large defects occur, the parameter correcting section 19 adjusts the parameter of the defect tester 70 so as to reduce the number of detections of large defects.

The analysis target selecting section 11, the region dividing section 12, the pattern feature quantity extracting section 13, the region classifying section 14, the defect coordinate matching section 15, the defect size distribution calculating section 16, the distribution comparing section 17, and the region extracting section 18 may be configured by dedicated hardware or may have a substantially equivalent function obtained by software with the CPU of a typical computer system.

The region division storing unit 21, the pattern feature quantity storing unit 22, the region classification storing unit 23, the defect information storing unit 24, the distribution function storing unit 25, and the program storing unit 26 may be configured by a semiconductor memory such as a semiconductor ROM and a semiconductor RAM and an auxiliary storage such as a magnetic disk storage device, a magnetic drum unit, and a magnetic tape unit or may be configured by a main storage in a CPU.

The estimation distribution "D(x)" may be a function inputted from the input device 50 by an operator.

Second Embodiment

Figure 14:
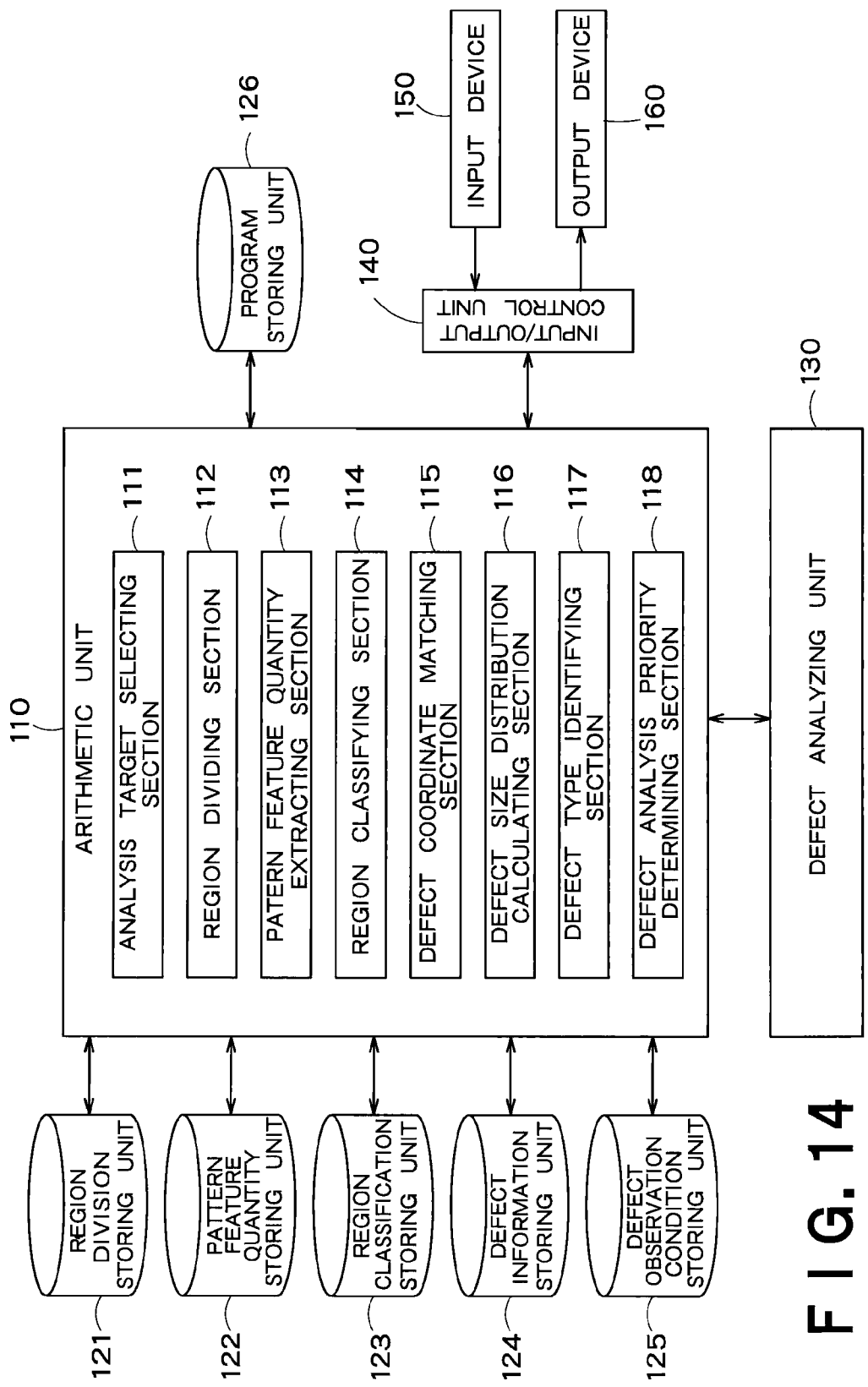
FIG. 14 is a schematic structural diagram showing a defect analyzer according to a second embodiment of the present invention.

FIG. 14 shows a schematic configuration of a defect analyzer according to a second embodiment of the present invention. The defect analyzer includes an arithmetic unit 110, a region division storing unit 121, a pattern feature quantity storing unit 122, a region classification storing unit 123, a defect information storing unit 124, a defect observation condition storing unit 125, a program storing unit 126, and a defect analyzing unit 130. The storing units and the defect analyzing unit 30 are connected to the arithmetic unit 10.

To the arithmetic unit 110, an input device 150 and an output device 160 are connected via an input/output control unit 140. The input device 150 receives an input such as data and a command from an operator and the output device 160 outputs a region where a defect analysis is performed.

The arithmetic unit 110 has an analysis target selecting section 111, a region dividing section 112, a pattern feature quantity extracting section 113, a region classifying section 114, a defect coordinate matching section 115, a defect size distribution calculating section 116, a defect type identifying section 117, and a defect analysis priority determining section 118.

The arithmetic unit 110 operates in response to a program command stored in the program storing unit 126.

The analysis target selecting section 111 selects a defect analysis target. To be specific, the analysis target selecting section 111 designates a kind of product, a manufacturing process of the product, and a region in the product.

The region dividing section 112 reads, from the region division storing unit 121, a region dividing definition corresponding to the analysis target and divides the selected analysis target into regions with a given size in a grid-like fashion.

The pattern feature quantity extracting section 113 extracts, from the pattern feature quantity storing unit 122, a pattern feature quantity having been converted to a number for each divided region (grid square). The pattern feature quantity is, for example, at least one selected from the coverage factor(=wiring area/grid square area) of a pattern, the perimeter of the pattern, the minimum line width, the maximum line width, and a defect size based on a critical area analysis, and so on. The feature quantity of the pattern can be determined from design data (mask data).

The region classifying section 114 reads a classification definition based on a feature quantity from the area classification storing unit 123, and classifies grid squares into a plurality of groups according to the definition.

The defect coordinate matching section 115 reads, from the defect information storing unit 124, position information about defects and superimposes the defects on the analysis target.

The defect size distribution calculating section 116 determines the number of defects for each size in each group and calculates a defect size distribution.

The defect type identifying section 117 determines whether defects are random defects or systematic defects by using the defect size distribution having been calculated by the defect size distribution calculating section 116. For example, the defect type identifying section 117 determines the approximate curve of the defect size distribution, compares a power value used as an index of inclination of the curve with a predetermined threshold value, and identifies whether the defects are random defects or systematic defects.

The defect analysis priority determining section 118 determines a priority order by using an identification result from the defect type identifying section 117 and defect observation conditions stored in the defect observation condition storing unit 125, and outputs defect information based on the priority order.

For example, when the defect observation condition storing unit 125 stores observation conditions that the defect analyzing unit 130 analyzes systematic defects, the defect analysis priority determining section 118 preferentially outputs defect information about the group where the presence of systematic defects is identified by the defect type identifying section 117.

The defect analyzing unit 130 analyzes defects by using the received defect information. The defect analysis includes, for example, data processing such as yield prediction and the acquisition of an image through a defect observing device.

The defect analyzing unit 130 uses the defect information in which whether defects are random defects or systematic defects has been determined. Thus it is possible to accurately analyze defects according to a purpose.

Figure 15:
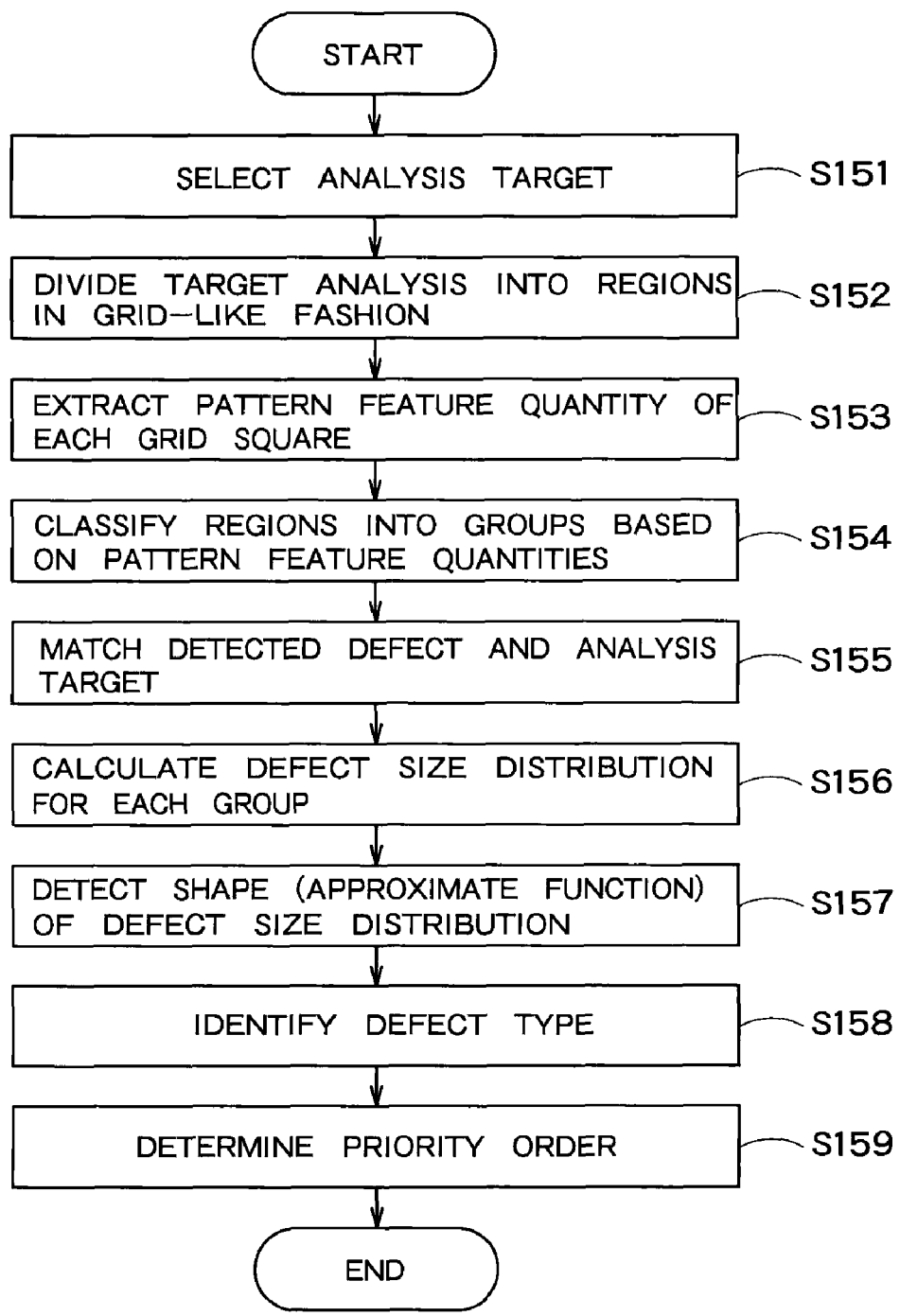
FIG. 15 is a flowchart showing a defect analyzing method of the second embodiment.

A defect analyzing method using the defect analyzer will now be described in accordance with the flowchart of FIG. 15 and examples shown in FIGS. 5 to 9 and FIGS. 16 to 18.

(Step S151) The analysis target selecting section 111 selects an analysis target. For example, as shown in FIG. 5, a region of a wafer is selected.

(Step S152) The region dividing section 112 divides the analysis target into regions in a grid-like fashion. For example, as shown in FIG. 6, the analysis target is divided into regions of a certain size in a grid-like fashion.

(Step S153) The pattern feature quantity extracting section 113 converts a pattern feature quantity into a number for each grid square and extracts the number. For example, as shown in FIG. 7, the pattern feature quantity extracting section 113 extracts feature quantities having been converted into numbers of 1 to 9 for the grid squares.

(Step S154) The region classifying section 114 classifies the grid squares into groups based on the feature quantities. For example, as shown in FIG. 8, the grid squares having feature quantities of 1 to 3 are designated as group A, the grid squares having feature quantities of 4 to 6 are designated as group B, and the grid squares having feature quantities of 7 to 9 are designated as group C.

(Step S155) The defect coordinate matching section 115 matches defect position information with the analysis target. For example, as shown in FIG. 9, detected defects are superimposed on the analysis target.

(Step S156) The defect size distribution calculating section 116 calculates a defect size distribution for each group. For example, as shown in FIG. 16, the number of defects of each size is determined for group A, group B, and group C.

Figures 17A, 17B, 17C:
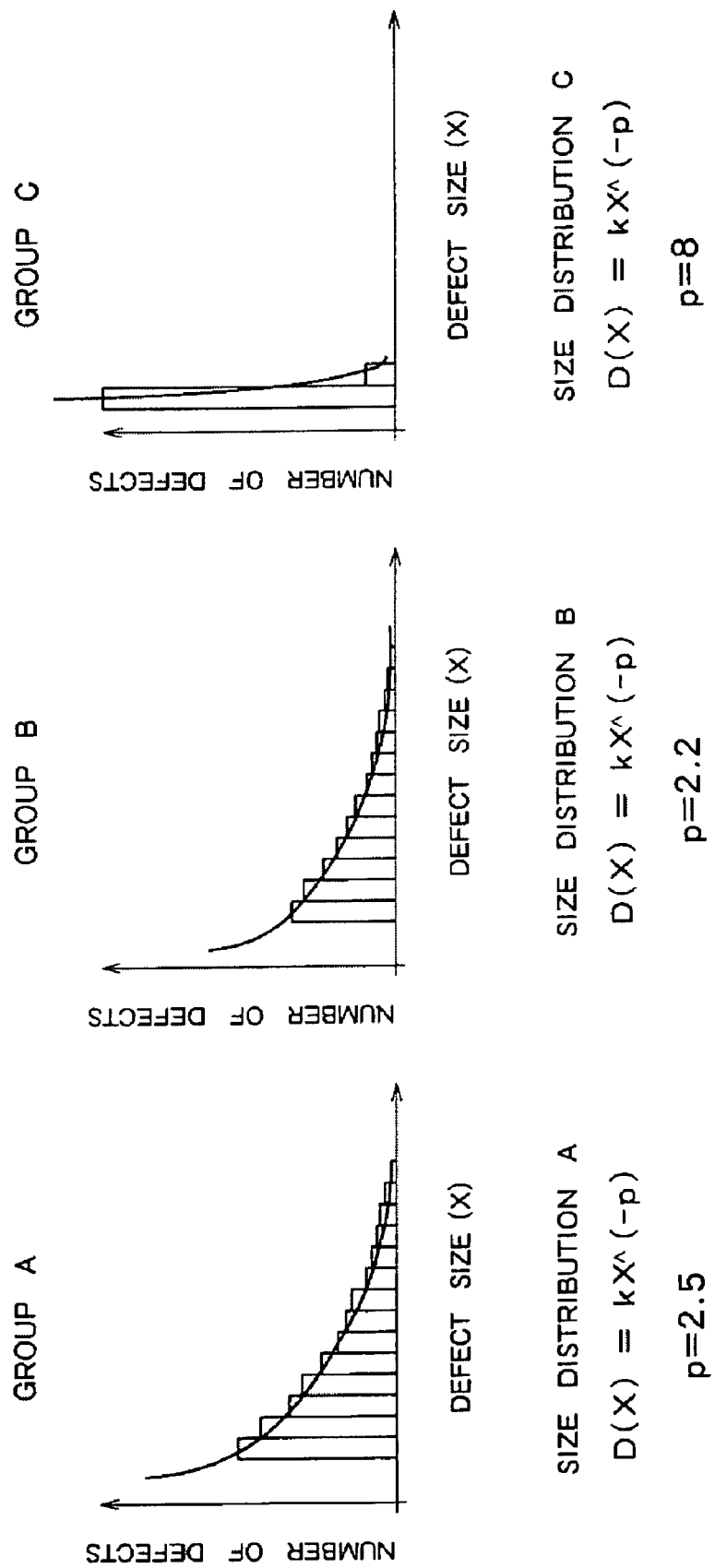
FIGS. 17(A)-(C) illustrate graphs each of which shows an example of a defect size distribution function.

(Step S157) The defect type identifying section 117 detects the shape (approximate function "D") of the defect size distribution having been determined in step S156. It is considered that as the defect size increases, the number of defects decreases. Thus a size distribution function "$D(x)$" can be represented as $D(x)=kx^p$ where "x" is a defect size ("k" and "p" are real numbers specified for the product). For example, as shown in FIG. 17, "k" and "p" are determined for each of groups A to C.

(Step S158) The defect type identifying section 117 compares a power value "p" used as an index of the inclination of distribution and a predetermined threshold value to determine whether defects in each group are random defects or systematic defects. For example, as shown in FIG. 18, when a random distribution is found while the power value "p" is in the range of $2<p<3$ and systematic defects are found while the power value "p" is outside the range, it is determined that groups A and B have random defects and group C has systematic defects.

(Step S159) The defect analysis priority determining section 118 assigns priorities to defect data corresponding to the types of defects to be analyzed by the defect analyzing unit 130, and outputs the defect data according to the priority order. For example, when the defect analyzing unit 130 analyzes random defects, defect detection data in the regions (grid squares) of groups A and B is given a high priority and is outputted.

As described above, even when random and systematic defects are detected in a mixed state, a combination with layout information makes it possible to classify the random and systematic defects, achieving defect analysis with high accuracy.

Further, it is possible to narrow down a systematic defect occurrence area, thereby constructing a sampling review plan for efficiently reviewing defects in the subsequent defect observation. In the defect observation, defects having been detected by a wafer tester are observed and classified with an optical microscope, an SEM, and so on. The defect observation is quite important as an information source for identifying an abnormality and a cause of failure.

For example, first, as shown in FIG. 19(A), grid squares are classified into groups. After that, defects are superimposed, the grid squares including defects are extracted as shown in FIG. 19(B), and the number of extracted grid squares is determined for each group.

For example, when it is determined that groups A and B have random defects and group C has systematic defects according to the defect analyzing method of the present embodiment, the defect analyzing unit 130 only has to observe the defect data in the grid squares of group C, thereby efficiently reducing the possibility of oversights of serious defects.

When defect types cannot be classified with high accuracy as in the prior art, it is necessary to observe all the defects, that is, all the twenty grid squares having defects in the example of FIG. 19(B), resulting in low efficiency.

In the present embodiment, it is only necessary to observe the grid squares included in the groups of defect types to be observed, thereby achieving high efficiency.

The defect analyzer of the present embodiment enables early detection/solution for critical defects such as systematic defects and thus is quite effective in immediately increasing the yields of the product. By filtering a systematic factor occurrence area having been extracted by the system, it is possible to accurately identify the occurrence level of random defects in the manufacturing line, thereby predicting the manufacturing yields of the product with high accuracy.

The defect analyzers of the foregoing embodiments are also applicable to the manufacturing of a device other than a semiconductor and the manufacturing of a mask. Moreover, the defect analyzers may be installed in a defect tester or a defect observing device. The defect analyzers of the foregoing embodiments may be configured by either hardware or software.

What is claimed is:

1. A defect analyzer system, comprising:
   a program storage device storing instructions; and
   an arithmetic unit executing the instructions to:
   divide a defect analyzing region of a wafer into a plurality of grid squares, the wafer having a circuit pattern formed thereon;
   store a pattern feature quantity based on design data of the circuit pattern;
   extract a pattern feature quantity for each of the grid squares from the stored pattern feature quantity;
   classify the plurality of grid squares into a plurality of groups based on the pattern feature quantities;
   store defect information including a defect position and size having been detected in the defect analyzing region;
   extract the defect information from the stored defect information and match the defect information with the defect analyzing region;
   determine the number of defects for each defect size in each of the plurality of groups and calculate a defect size distribution;
   compare the defect size distribution and a predetermined estimation distribution in each of the plurality of groups and calculate a difference; and
   compare the difference of each of the plurality of groups and a predetermined threshold value, extract the group having the difference equal to or smaller than the predetermined threshold value, and output the defect information corresponding to the extracted group.

2. The defect analyzer system according to claim 1, further comprising a defect analyzing unit configured to perform defect analysis using the defect information outputted from the arithmetic unit.

3. The defect analyzer system according to claim 1, wherein the arithmetic unit executes the instructions to correct a test parameter of a defect tester which tests a defect of the wafer, based on a comparison result of the predetermined estimation distribution and a defect size distribution of a group having not been extracted by the arithmetic unit.

4. The defect analyzer system according to claim 1, wherein the pattern feature quantity is at least one selected from a pattern coverage factor, a pattern perimeter, and a defect size based on a critical area analysis.

5. A defect analyzing method comprising:
dividing, by an arithmetic unit, a defect analyzing region of a wafer into a plurality of grid squares, the wafer having a circuit pattern formed thereon;
extracting, by the arithmetic unit, a pattern feature quantity for each of the grid squares based on design data of the circuit pattern;
classifying, by the arithmetic unit, the plurality of grid squares into a plurality of groups based on the pattern feature quantities;
matching, by the arithmetic unit, the defect analyzing region with defect information including a defect position and size having been detected in the defect analyzing region;
determining, by the arithmetic unit, the number of defects for each defect size in each of the plurality of groups and calculating a defect size distribution;
comparing, by the arithmetic unit, the defect size distribution of each of the plurality of groups and a predetermined estimation distribution and calculating a difference;
comparing, by the arithmetic unit, the difference of each of the plurality of groups and a predetermined threshold value and extracting the defect information corresponding to the group having the difference equal to or smaller than the predetermined threshold value; and
performing, by a defect analyzing unit, defect analysis using the extracted defect information.

6. The defect analyzing method according to claim 5, further comprising correcting, by the arithmetic unit, a test parameter of a defect tester which tests a defect of the wafer, based on a comparison result of the predetermined estimation distribution and a defect size distribution of a group having the difference larger than the predetermined threshold value.

7. The defect analyzing method according to claim 5, wherein the pattern feature quantity is at least one selected from a pattern coverage factor, a pattern perimeter, and a defect size based on a critical area analysis.

8. A defect analyzer system comprising:
a grogram storage device storing instructions; and
an arithmetic unit executing the instructions to:
divide a defect analyzing region of a wafer into a plurality of grid squares, the wafer having a circuit pattern formed thereon;
store a pattern feature quantity based on design data of the circuit pattern;
extract a pattern feature quantity for each of the grid squares from the stored pattern feature quantity;
classify the plurality of grid squares into a plurality of groups based on the pattern feature quantities;
store defect information including a defect position and size having been detected in the defect analyzing region;
extract the defect information from the stored defect information and match the defect information with the defect analyzing region;
determine the number of defects for each defect size in each of the plurality of groups and calculate a defect size distribution; and
identify whether the defects in each of the plurality of groups are random defects or systematic defects, based on the defect size distribution.

9. The defect analyzer system according to claim 8, wherein the arithmetic unit executes the instructions to calculate an approximate function of the defect size distribution and identifies whether the defects are random defects or systematic defects based on a power value of the approximate function.

10. The defect analyzer system according to claim 8, wherein the arithmetic unit executes the instructions to determine a priority order of defect analysis on the plurality of groups based on an identification result of the defects in each of the plurality of groups, and output the defect information corresponding to the groups according to the priority order.

11. The defect analyzer system according to claim 10, further comprising a defect analyzing unit configured to perform defect analysis using the defect information outputted from the arithmetic unit.

12. The defect analyzer system according to claim 8, wherein the pattern feature quantity is at least one selected from a pattern coverage factor, a pattern perimeter, and a defect size based on a critical area analysis.

13. A defect analyzing method comprising:
dividing, by an arithmetic unit, a defect analyzing region of a wafer into a plurality of grid squares, the wafer having a circuit pattern formed thereon;
extracting, by the arithmetic unit, a pattern feature quantity for each of the grid squares based on design data of the circuit pattern;
classifying, by the arithmetic unit, the plurality of grid squares into a plurality of groups based on the pattern feature quantities;
matching, by the arithmetic unit, the defect analyzing region with defect information including a defect position and size having been detected in the defect analyzing region;
determining, by the arithmetic unit, the number of defects for each defect size in each of the plurality of groups and calculating a defect size distribution;
identifying, by the arithmetic unit, whether the defects in each of the plurality of groups are random defects or systematic defects, based on the defect size distribution;
determining, by the arithmetic unit, a priority order of defect analysis on the plurality of groups based on an identification result and extracting the defect information corresponding to each of the groups according to the priority order; and
performing, by a defect analyzing unit, defect analysis using the extracted defect information.

14. The defect analyzing method according to claim 13, further comprising calculating, by the arithmetic unit, an approximate function of the defect size distribution and identifying whether the defects are random defects or systematic defects based on a power value of the approximate function.

15. The defect analyzing method according to claim 13, wherein the pattern feature quantity is at least one selected from a pattern coverage factor, a pattern perimeter, and a defect size based on a critical area analysis.

* * * * *